United States Patent [19]

Nakano

[11] Patent Number: 4,669,062
[45] Date of Patent: May 26, 1987

[54] TWO-TIERED DYNAMIC RANDOM ACCESS MEMORY (DRAM) CELL

[75] Inventor: Motoo Nakano, Yokohama, Japan

[73] Assignee: Fujitsu Limited, Kanagawa, Japan

[21] Appl. No.: 778,542

[22] Filed: Sep. 20, 1985

[30] Foreign Application Priority Data

Sep. 21, 1984 [JP] Japan ................... 59-198840

[51] Int. Cl.$^4$ .................................. G11C 11/34
[52] U.S. Cl. ...................... 365/174; 365/189; 357/23.7
[58] Field of Search ................... 357/23.6, 23.7; 365/174, 189

[56] References Cited

U.S. PATENT DOCUMENTS 4,476,475 10/1984 Naem et al. .................. 357/23.7
4,487,635 12/1984 Kugimiya et al. ............. 357/23.7 X Primary Examiner—Joseph A. Popek
Attorney, Agent, or Firm—Staas & Halsey

[57] ABSTRACT

A dynamic random access memory (DRAM) cell has three MIS transistors arranged in a two-tiered structure with high packing density. A read select MIS transistor has source, drain and channel regions formed in the substrate and is covered by a first insulating layer and a semiconductor layer. A write select MIS transistor has source and drain regions formed in the semiconducting layer, the first insulating layer having a contact window therein through which the drain regions of the write select and read select MIS transistors are connected. A storage MIS transistor has source, channel and drain regions formed in the substrate, the channel region of the storage MIS transistor comprising the source region of the read select MIS transistor and the drain region of the storage MIS transistor comprising the channel region of the read select MIS transistor, the respective channel regions of the read and storage MIS transistors being formed in a common level in the silicon substrate and directly connected therein between the source region of the storage MIS transistor and the drain region of the read select MIS transistor. The write select MIS transistor further may comprise a separate gate electrode, the gate electrodes of the write and read MIS transistors comprising portions of corresponding, separate conducting lines serving as write select and read select lines, respectively.

14 Claims, 14 Drawing Figures

TWO-TIERED DYNAMIC RANDOM ACCESS MEMORY (DRAM) CELL

BACKGROUND OF THE INVENTION

1. Field of the Invention

The present invention relates to a dynamic random access memory (hereinafter, "DRAM") cell, and, more particularly, to the structure of such a DRAM cell having a two-tiered arrangement of electrical elements for achieving a high packing density. Even more particularly, the present invention relates to a two-tiered arrangement of a three transistor DRAM cell having, in accordance with different embodiments of the invention, either two or three driving lines in addition to a ground line.

2. State of the Prior Art

Random access memory (RAM) devices, fabricated utilizing metal-oxide-semiconductor (MOS) technology, are widely used as memories of various types of electronic devices, particularly including computers. RAM devices may be of either of two basic, different types, namely static MOS RAM's and dynamic MOS RAM's. Static MOS memories, relative to dynamic MOS memories, usually have higher operating speeds, but also have higher power dissipation. Conversely, whereas dynamic MOS RAM'S (DRAM's) occupy less area on the substrate and have relatively lower power consumption and thus reduced power dissipation, rendering them more suitable for higher density packing, such devices typically have relatively slower operating speeds and require more elaborate control circuits. In view of the relative advantages afforded thereby, and in spite of their limitations as noted, DRAM's are becoming used as high capacity storage devices on an increasing basis. Heretofore, a great deal of effort has been exerted for achieving ever higher packing densities of DRAM's, including designs directed to reducing the number of transistors required for each DRAM cell.

In fact, DRAM cells employing only a single transistor have been developed and are widely used, such single transistor DRAM cells requiring only two control lines, namely, a bit line and a word line. Such single transistor DRAM cells, however, typically require a very sensitive sense amplifier, because the output signal from the cell is read out as a potential difference of the associated bit line of the cell, as produced thereon by a charge stored in the cell capacitance. Particularly, when the cell is read out, a substantial portion of the electrical charge stored in the cell is consumed, or dissipated, in charging up the parasitic capacity of the bit line, thereby substantially reducing the potential difference to a very small value and correspondingly producing a very faint, or weak, output signal. Moreover, as the packing density level increases, there is a tendency in such DRAM cells for the cell capacity to decrease whereas the parasitic capacity of the associated data bit line remains almost unchanged. This tendency contributes to a further reduction in the potential difference and correspondingly the output signal level on the data bit line, and imposes a corresponding requirement of even greater sensitivity of the associated sense amplifiers and/or ultimately, a limitation on the packing density of the DRAM cells which may be achieved.

Other types of DRAM cells have also been developed which overcome the foregoing disadvantages of single transistor DRAM cells, including particularly a number of varieties of three-transistor DRAM cells, an illustrative such cell being shown in FIG. 1.

More particularly, FIG. 1 is a circuit schematic of a prior art, three-transistor DRAM cell comprising transistors T1, T2 and T3 interconnected through a shared read/write (R/W) data bit line DL, and having as individual or separate lines, a read select line RL and a write select line WL respectively connected to the gates of transistors T1 and T2, the drain of transistor T3 being connected to ground. Information is stored in the cell of FIG. 1 in accordance with the potential level of the gate electrode of the storage transistor T3, in the effective gate capacitor C connected between junction A and ground as illustrated in dotted line. The stored information is output on the date bit line DL by switching both the storage transistor T3 and the read select transistor T1 to a conductive state, thus discharging the data bit line DL to ground potential. Because of its circuit configuration and operation, a three-transistor DRAM cell as in FIG. 1, compared to one-transistor such cells, produces a significantly higher difference in the voltage level of the data bit line DL and correspondingly an output signal of significantly higher voltage level. As a result, a relatively more simple sense-amplifier is sufficient for purposes of detecting the output signal from the cell, permitting a reduction in the required area for the sense-amplifier region and effectively a higher packing density of an array of such DRAM cells. On the other hand, in such three-transistor DRAM cells, not only is the number of transistors necessarily greater than in a one-transistor DRAM cell, but also the number of control lines is likewise greater. When the three transistors and associated control lines of such a DRAM cell are arranged on a common plane, the cell thus occupies a relatively large area and adversely affects the packing density which can be achieved.

Accordingly, two-tiered structures have been developed for fabricating three-transistor DRAM cells, in an effort to achieve a few increased packing densities while nevertheless retaining the operational advantages of three-transistor DRAM cells, relative to one-transistor DRAM cells. There nevertheless remains a need for improved arrangements of such two-tiered structures in the interests of achieving improved packing densities while retaining the desired operational characteristics.

SUMMARY OF THE INVENTION

Accordingly, it is an object of the present invention to provide an improved two-tiered structure of a three-transistor DRAM cell which enables achieving higher packing density.

A further object of the present invention is to provide a two-tiered three-transistor DRAM cell having an arrangement of elements and associated control lines which reduces the area occupied by the cell.

Still a further object of the present invention is to provide a two-tiered three-transistor DRAM cell in which the number of control lines is reduced, and particularly from three lines to two lines (not including the ground line), by comparison with prior art such cells.

With reference to the prior art three-transistor DRAM cell of FIG. 1, and as before described, both transistors T1 and T3 must be conductive for reading a stored signal "0", in which operation a current flows between the data bit line DL and the ground GND. Conversely, to read a stored signal "1", transistor T1 is rendered conductive and transistor T3 is maintained nonconductive such that no current flows through the transistor circuits T1-T3.

In accordance with the present invention, this operating characteristic, or sequence, has been further analyzed, resulting in the recognition that a dual gate field effect transistor may be employed, in which the connection between transistors T1 and T3, through the respective source-drain regions, can be omitted, enabling greater economies in the use of the area on the relevant substrate for implementing the DRAM device.

As also before noted, two-tiered structures are frequently utilized to reduce the area required by memory cells fabricated on a substrate, the electrical components of which being arranged on the respective two layers or tiers and separated from each other by an insulating layer. The present invention provides an improved such two-tiered structure of a three-transistor DRAM cell, affording yet higher packing densities while retaining desired operating characteristics.

More particularly, in accordance with the present invention, a read select transistor T1, a storage transistor T3 and a read select line RL, which acts as the gate electrode of the transistor T1, are formed directly on the surface of a silicon substrate; an insulating layer then is formed thereover, and a write transistor T2 and word select line WL, which acts as the gate of the transistor T2, then are formed on the insulating layer. A phosphosilicate glass layer then is formed so as to cover the entire substrate, and a data bit line DL is formed thereover.

A particular feature of a DRAM memory cell in accordance with the present invention relates to the arrangement of the transistors therein, in accordance with which the write select transistor T2 overlies the read select transistor T1, and a common channel region is formed which is partially overlayed by the gates of the read select transistor T1 and the storage transistor T3. Thus, the transistors T1 and T3 act like a dual gate transistor; as a result, a considerable savings in area is achieved for the fabrication of the connection between the two transistors—which, in accordance with prior art circuits, usually includes at least the respective source-drain regions thereof. Additionally, due to the overlying relationship of transistor T2 on transistor T1, in the circuit configuration of a DRAM cell in accordance with the present invention, one of the source-drain regions of transistor T2 is used in common as the gate electrode of the transistor T3, thereby contributing to additional savings of space on the substrate.

Furthermore, the present invention affords, in accordance with a specific embodiment thereof, an improved circuit configuration of the DRAM cell, wherein the control lines are reduced, relative to prior art such circuits, from three lines to two lines, namely, a shared write/read bit line and a shared write/read select line, the circuit furthermore employing two transistors in the cell having respective, different threshold voltages. In accordance with the new circuit configuration of this embodiment, the present invention achieves further simplification of a two-tiered structure for a DRAM cell.

These and other features and advantages of the invention will become apparent from the following detailed description of various specific embodiments thereof, taken with reference to the accompanying drawings, wherein like reference numerals denote like parts.

BRIEF DESCRIPTION OF THE DRAWINGS

FIG. 5(a) is a cross-sectional view of the three-transistor DRAM cell, illustrating the formation of a gate electrode and a diffusion region;

FIG. 5(b) is a cross-sectional view of the cell after completion of the step of p-type doping of an SOI layer covering the substrate;

FIG. 5(c) is a cross-sectional view of the cell after completion of the step of forming further gate electrodes;

FIG. 5(d) is a cross-section view of the cell, illustrating an n-type ion implantation process for forming a diffused region; and FIG. 5(e) is a cross-sectional view of the cell, illustrating the structure thereof after formation of a data bit line.

DESCRIPTION OF THE PREFERRED EMBODIMENTS

Figure 1:
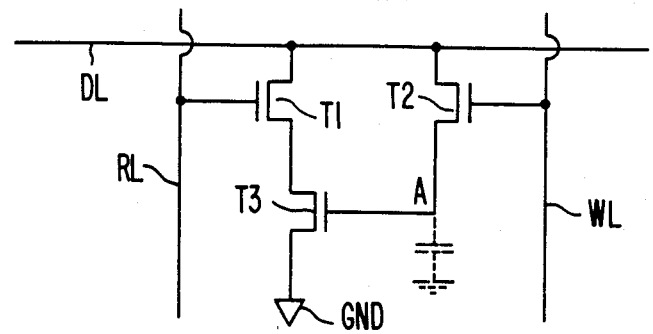
FIG. 1 is a circuit schematic of a prior art three-transistor DRAM cell.
Figure 2A:
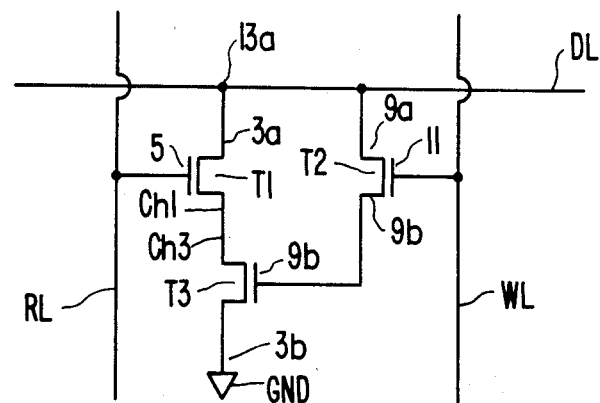
FIG. 2(a) is an equivalent circuit schematic of a three-transistor DRAM cell in accordance with a first embodiment of the present invention.
Figure 2B:
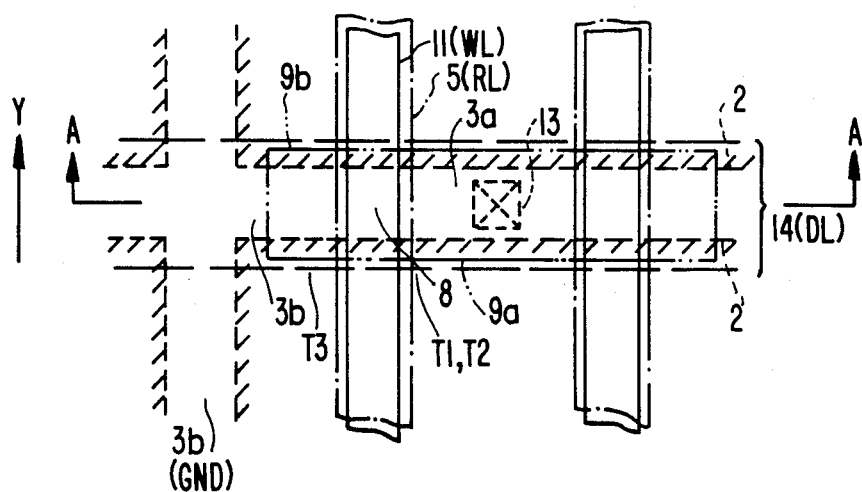
FIG. 2(b) is a partial plan view of the structure of the three-transistor DRAM cell in accordance with the first embodiment of the invention.
Figure 2C:
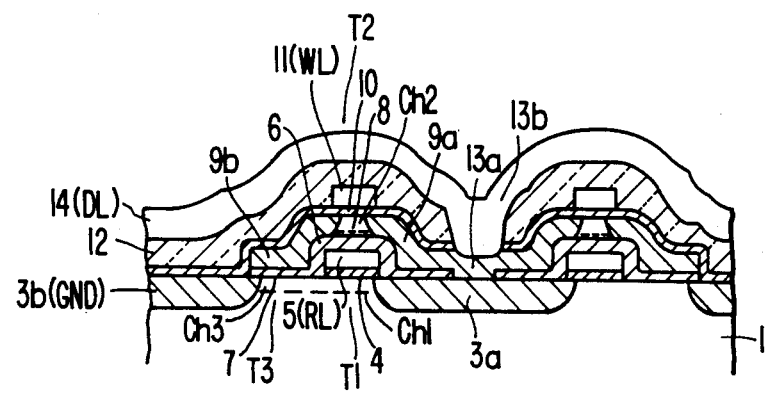
FIG. 2(c) is a cross-sectional view of the cell of FIG. 2(b), taken along the line A—A therein.

FIGS. 2(a)-2(c) illustrate a first embodiment of a three-transistor, two-tier DRAM cell in accordance with a first embodiment of the present invention. The DRAM cell, as shown in the equivalent circuit schematic of FIG. 2(a), comprises three transistors and three control lines; while the circuit configuration appears quite similar to that of a conventional three-transistor DRAM cell as shown in FIG. 1, significant exceptions, or differences, exist as to the channel regions Ch1, Ch3 and the regions 3a, 3b, and 9a, 9b denoting variously source drain regions of the respective transistors T1, T2 and T3, as later detailed; these designations, moreover, respectively correspond to the identical such designations appearing in the plan view of FIG. 2(b) and in the cross-sectional view of FIG. 2(c), the latter taken along the line A—A in FIG. 2(b).

With concurrent reference to the equivalent circuit of FIG. 2(a) and the structural, plan and cross-sectional views of FIGS. 2(b) and 2(c), the three-transistor, two-tier DRAM cells of the present invention are formed on a p-type silicon substrate 1 having field oxide layers 2 thereon (best seen in the plan view of FIG. 2(b) and illustrated therein by hatched lines), the latter serving to define transistor regions and ground lines therebetween. In the substrate 1, there are formed an n+type drain region 3a and an n+type source region 3b having a channel region Ch1+Ch3 extending therebetween.

MOS transistor T1, which functions as a read select transistor in the DRAM cell, comprises the drain region 3a, the channel region Ch1, the channel region Ch3 as the source region of transistor T1, a channel insulating layer 4 of silicon dioxide (SiO₂) of approximately 300 Å thickness formed over the channel Ch1, and a gate electrode 5 made of tungsten-silicide (WSi₂) or polycrystalline silicon, for example. The gate electrode 5 of transistor T1 is covered by an insulating layer 6 formed of SiO₂ and having a thickness of approximately 5,000 Å and over which a write select transistor T2 is formed.

The write select transistor T2, formed in an overlying or superposed relationship on the read select transistor T1, comprises a first diffusion region 9a of n+type serving as the drain region, a second diffusion region 9b of n+type serving as the source region, a gate insulating layer 10 of SiO₂ having a thickness of approximately 300 Å, a channel region alternatively designated both as Ch2 and 8, and a gate electrode 11. The silicon layer 8 is of p-type, has a thickness of 5,000 to 8,000 Å, and is formed using a silicon-on-insulator (SOI) technology. The first diffusion region 9a and the second diffusion region 9b are formed in the silicon layer 8. The region 9a extends over an insulating layer 7, the latter formed of SiO₂ in a thickness of approximately 300 Å and which extends on the surface of substrate 1 from the edges of the thicker insulating layer 6 covering the gate electrode 5, and through a contact window 13a for connection to the drain region 3a of read select transistor T1.

The storage transistor T3 comprises a source region 3b, a drain region Ch1 (which is used, in common, as the channel Ch1 for the read select transistor T1), a gate insulating layer comprising the insulating layer 7, the channel region Ch3 (also functioning as the source region of transistor T1) and a gate electrode 9b (which functions in common as the source region of the write select transistor T2).

The read select transistor T1 and the storage transistor T3, in view of the structural arrangement thus provided, may be regarded as a single, combined device comprising a dual gate field effect transistor (FET), the dual gate FET comprising a drain region 3a, a source region 3b, a channel region Ch1+Ch3, two gate insulating layers 4 and 7 and two gate electrodes 5 and 9b. Further, by superposing, or overlaying, the write select transistor T2 on the read select transistor T1, one of the source region 9b and drain region 9a of transistor T2—and, for the arrangement as above specified, specifically, the source region 9b— is used in common as the gate electrode of the storage transistor T3. These two, shared structural features serve to increase substantially the packing density of the cell.

As indicated by the arrow Y in FIG. 2(b), the gate electrode 5 of the read select transistor T1 and the gate electrode 11 of the write electrode transistor T2 are formed as portions of conducting lines which extend in the Y direction and respectively function as a read select line RL and a word select line WL. The aforerecited transistors and conducting lines of the device then are covered by a phosphosilicate glass layer 12 (see FIG. 2(c)) over which a data bit line 14 (DL) is formed, extending in a direction (X) perpendicular to the designated Y direction, the data bit line 14 (DL) being connected to the drain regions 9a and 3a, in succession, by extending through a contact hole 13b formed in the phosphosilicate glass layer 12. Further, the source region 3b (see FIG. 2(b) and 2(a)) extends in a desired direction from the cell, to function as a ground line GND. The structure as thus afforded and described in connection with FIGS. 2(b) and 2(c) completes the circuit of the cell in accordance with the equivalent circuit schematic of FIG. 2(a).

To write a logical "0" into the cell, the data bit line DL is maintained at a high level and the write select line WL, comprising as well the gate electrode 11 of the write select transistor T2, is raised to a higher voltage level, thereby turning the write select transistor T2 "ON", in turn raising the gate electrode 9b of the storage transistor T3 to a high level voltage and thereby keeping the transistor T3 in an "ON" state. Thereafter, the write select transistor T2 is turned "OFF", which maintains the the gate electrode 9b of the storage transistor T3 at a high voltage level, thus storing a logical "0".

When reading a stored logical "0" from the cell, the data bit line DL is brought to a predetermined voltage level, such as an intermediate voltage Vm (i.e., intermediate the aforementioned high and low levels) and maintained in a floating state. Thereafter, the read select transistor T1 is turned "ON". Since the storage transistor T3 is kept in an "ON" state, current flows from the data bit line DL to the ground line GND through the read select transistor T1 and the storage transistor T3, both of which are in the "ON" state, thereby substantially pulling the voltage of the data bit line DL down to the ground voltage level. The reduced voltage level on the data bit line DL thus represents the stored, logical "0".

To write a logical "1" into the cell, the data bit line DL is maintained at a low voltage level and simultaneously the write select transistor T2 is turned "ON", thereby producing a low voltage level at the gate of the storage transistor T3. The write select transistor T2 then is turned "OFF", which serves to maintain the low voltage level on the storage transistor T3 and thus to maintain the storage transistor T3 in an "OFF" state.

When reading out a stored logical "1" from the cell, the data bit line DL is maintained at the intermediate voltage level Vm, for example, and the read select transistor T1 is turned "ON". Since the storage transistor T3 is maintained in an "OFF" state, no current flows through the circuit comprising the storage transistor T3 and the read select transistor T1; as a result, the voltage of the data bit line DL is maintained at the level Vm, and results in there being no voltage difference on the data bit line DL, correspondingly representing a stored logical "1".

In accordance with the foregoing discussion, the DRAM cell of the first embodiment of the present invention operates in the same manner as the prior art DRAM cell of FIG. 1. However, in accordance with the improved structure afforded by the invention, the storage transistor T3 and the read select transistor T1 share, or commonly possess, their respective channel regions Ch3 and Ch1, thus eliminating the diffusion regions as usually are employed in the prior art for connecting these functional transistor elements together. Further, one of the source-drain regions of the write select transistor T2 is used in common, or is shared, as the gate electrode of the storage transistor T3. As a result, the area of a substrate occupied by the DRAM cell of the invention is significantly reduced compared to prior art such cells, thus contributing to a significant increase in the packing density of DRAM cells constructed in accordance with the invention. In addition, the gate electrode 9b of the storage transistor T3, which functions to store information in the form of electrical charges, is isolated electrically from the substrate 1 by the surrounding silicon dioxide layer 6, 7 which functions to prevent soft error problems, such as conventionally are caused by alpha ray radiation.

Figure 2D:
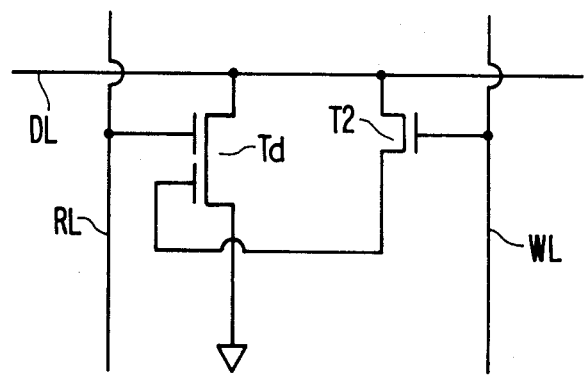
FIG. 2(d) is an equivalent circuit schematic, corresponding to that of FIG. 2(a), which clarifies the concept of a dual gate field effect transistor as implemented by the structure of a three-transistor DRAM cell in accordance with the present invention.

An alternative presentation of the equivalent circuit schematic of the structure of the first embodiment of the invention, as shown in FIGS. 2(b) and 2(c), is presented in FIG. 2(d), the latter representing a dual-gate electrode MOS transistor Td which performs the same function as the series-connected transistors T1 and T3. As will be apparent to those of skill in the art, the equivalent circuit representations in the schematics of FIGS. 2(a) and 2(d) have the same effect and function in terms of their respective circuit operations.

Figure 3A:
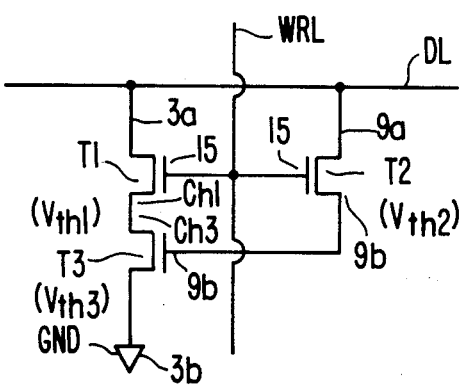
FIG. 3(a) is an equivalent circuit schematic of a three-transistor DRAM cell in accordance with a second embodiment of the present invention, which achieves a reduction in the number of driving lines relative to that of the DRAM cell of FIG. 2(a)
Figure 3B:
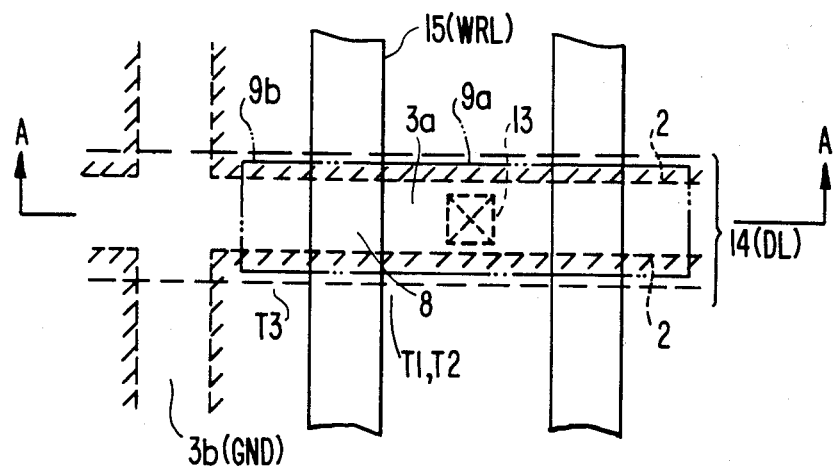
FIG. 3(b) is a partial plan view of the structure of a three-transistor DRAM cell in accordance with the second embodiment of the invention.
Figure 3C:
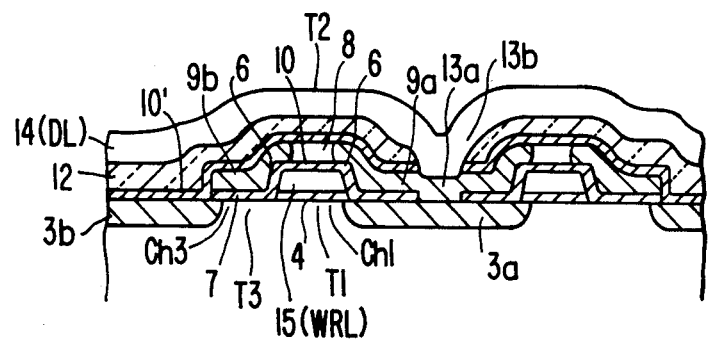
FIG. 3(c) is a cross-sectional view taken along the line A—A of FIG. 3(a)

FIGS. 3(a)-3(c) illustrate a second preferred embodiment of the present invention. The DRAM cell in accordance with this second embodiment comprises three transistors T1, T2 and T3 and two control lines, as illustrated in the equivalent circuit schematic of FIG. 3(a). By comparison to the DRAM cell of FIG. 2(a), the read select line RL and the write select line WL therein are now replaced in the circuit of FIG. 3(a) by a single write/read select line WRL, to which the respective gate electrodes of the write select transistor T2 and the read select transistor T1 are connected. The threshold voltages of the transistors T1, T2 and T3 are designated by $V_{th1}$, $V_{th2}$ and $V_{th3}$, respectively, and the respective voltage levels applied to the write/read select line WRL for selectively performing writing or reading operations are designated $V_w$ and $V_r$. The voltage level of the data bit line DL, namely the data signal output, is designated by $V_d$. To provide for selective operation of the transistors T1 and T2, the same are fabricated to have respective threshold voltages $V_{th1}$ and $V_{th2}$ of different levels. Thus, further simplification of the DRAM cell is achieved by the elimination of one of the control lines employed by the first embodiment of the invention.

FIG. 3(b) is a partial plan view of a DRAM cell in accordance with the second embodiment of the present invention and FIG. 3(c) is a cross-sectional view of the cell taken along the line A—A in FIG. 3(b).

The structural elements illustrated in FIGS. 3(b) and 3(c) having the same alpha numeric designations as in FIGS. 2(b) and 2(c) are the same and perform the same functions as in the first embodiment of FIGS. 2(a)-2(c), and thus are not further described herein; it will be apparent, moreover, that the write/read line WRL designated as line 15 (WRL) in FIGS. 3(b) and 3(c) is the structural equivalent of the separate read line 5 (RL) and permits omitting the separate write line 11 (WL) and the associated insulating layer 10 in the structure of FIGS. 2(b) and 2(c). Reference numeral 10' denotes an insulator layer of $SiO_2$.

Taking the threshold voltage of storage transistor T3 as: $V_{th3} = V_{th1}$, the relationships required for the above threshold voltage levels are as follows:

$V_{th1} < V_r < V_{th2}$ (read-out condition)
$V_d + V_{th2} < V_w$ (write-in condition)
$V_{th1} < V_d$ (readable condition)

To write a signal into the cell, transistor T2 is made conductive by holding the write/read select line 15 (WRL) at $V_w$. Thereafter, depending upon the logic level of the input signal to be written, an input signal voltage of either 0 volt level or a level $V_d$ is applied to the data bit line 14 (DL) and thus through transistor T2 to the gate 9b of storage transistor T3, correspondingly switching storage transistor T3 either to its "OFF" state or its "ON" state. In this circuit configuration, the read select transistor T1 also is made conductive simultaneously due to the common connection of the gates of transistors T1 and T2 to the write/read select line 15 (WRL). When the input data signal to be stored is of a 0 volt level, no current flows through the series-connected transistors T1 and T3 since the storage transistor T3 is in the "OFF" state, and thus the intended circuit operation occurs. However, when the input data signal is of the level $V_d$, a current flows from the data bit line DL to the ground line GND, which may have an adverse effect on the ability of the cell to hold the voltage of the data bit line DL at the voltage $V_d$. Accordingly, in order to maintain the voltage level $V_d$ of the data bit line DL substantially unchanged, the equivalent resistance of the associated driving circuit line DL must be made substantially lower than the series resistance of the conducting series circuit of transistors T1, T3.

When reading out a stored data signal from the DRAM cell, the voltage level of the write/read select line WRL is held at the level $V_r$, turning read select transistor T1 "ON" and turning write select transistor T2 "OFF", in accordance with the required level, or condition, of the read signal $V_r$ as above set forth. Thus, the voltage level at the gate of the storage transistor T3 remains unchanged. When the stored data signal is represented by a "0" voltage level of the gate of the storage transistor T3, no current flows from the data bit line DL to the ground line GND since transistor T3 is in the "OFF" state. Accordingly, the voltage level of the data bit line DL remains unchanged, and its output, as produced through a sense amplifier, affords a representation of a stored information or data signal "1". Conversely, when the stored data signal is of the level $V_d$, which renders the storage transistor T3 conductive, charges in the data bit line DL cause a current flow to the ground line GND, resulting in a substantial reduction, or fall-off, of the voltage level of the data bit line DL; this voltage decrease, or falloff, produces an output through the sense amplifier comprising a representation of a "0" stored data signal.

In accordance with the foregoing description, the improved two-tiered structure and circuit configuration in accordance with the present invention afford a DRAM cell having a high packing density. Further, the present invention affords a structure for the DRAM device which is easy to fabricate and thus contributes to a reduction in manufacturing costs. An example of a method for fabricating a DRAM cell having a structural configuration and operation in accordance with the present invention is set forth below with reference to the partial plan view of FIG. 1 and the partial cross-sectional views of FIGS. 5(a)-5(e), taken at successive stages of the fabrication of a DRAM cell in accordance with the first embodiment of the invention, along the line A—A in FIG. 4.

Figure 4:
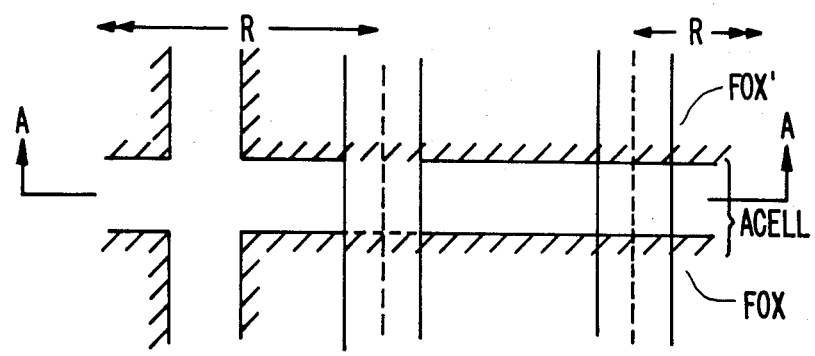
FIG. 4 is a plan view of a three-transistor DRAM cell in accordance with the first embodiment of the invention, illustrating the location of the successive cross-sectional views of FIGS. 5(a)-5(e); inclusive.
Figure 5A:
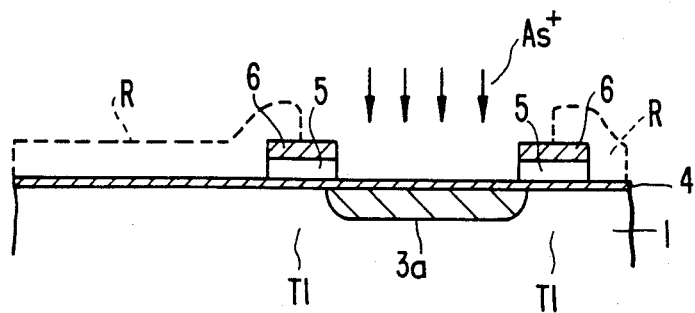
FIGS. 5(a)-5(e), inclusive, are cross-sectional views of the three-transistor DRAM cell of FIG. 4, taken along the line A—A therein, illustrating successive stages in the fabrication of the three-transistor DRAM cell in accordance with the first embodiment of the present invention.

With initial reference to FIG. 4 and FIG. 5(a), a p-type silicon substrate 1 is suitably prepared, and field oxide layers FOX are formed thereon by a conventional method thereby to define transistor regions $A_{cell}$; a first gate insulator layer 4 of approximately 300 Å in thickness then is formed over the transistor regions $A_{cell}$ by a conventional thermal oxidation method. There are then formed on the gate insulating layer 4, as successive laminated layers, a tungsten silicide ($WSi_2$) layer 5 of approximate 2,000 Å thickness and an $SiO_2$ layer 6 of approximately 5,000 to 8,000 Å thickness, each by conventional chemical vapor deposition (CVD) methods. Through use of ordinary patterning techniques, there are then formed a gate electrode 5 and an $SiO_2$ insulating layer 6 thereover, for a read select transistor T1. The gate electrode 5 extends over the substrate 1 and thus functions as a read select line RL. A photoresist mask R (shown by dotted lines in FIG. 5(a) and additionally by the arrows labelled R in FIG. 4) then is formed over the surface of the substrate selectively, so as to expose surface areas of the substrate corresponding to predetermined regions in which data bit lines are to be formed. As indicated by the arrows designated As in FIG. 5(a), arsenic (As) ions are implanted into the exposed areas of the silicon substrate at a dosage of $5 \times 10^{15}$ cm$^{-2}$ with an accelerating energy of 100 KeV; after implantation, the photoresist mask R is removed and conventional heat processing applied for diffusing the implanted As dopants to form an n+type drain region 3a, as seen in FIG. 5a.

Figure 5B:
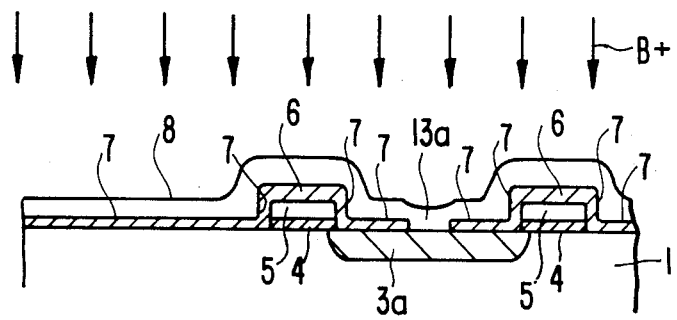

With reference to FIG. 5(b), the exposed surface of the patterned gate electrode 5 formed on the gate insulator layer 4 of $SiO_2$ then is etched by conventional plate etching and a second gate insulating layer 7 of $SiO_2$ of approximately 300 Å is formed by a conventional thermal oxidizing method. As a result, on the side surfaces of the gate electrode 5 a relatively thick layer 7 of $SiO_2$ of approximately 500 Å is formed.

A contact window 13a then is opened in the second gate insulating layer 7, by conventional masking techniques, over the n+drain region 3a; a thick polycrystalline silicon layer of approximately 5,000 thickness then is formed over the entire surface of the substrate 1. The polycrystalline silicon layer then is converted to a single crystal layer by irradiation, either through use of a laser beam or an electron beam having a predetermined energy level providing sufficient heating. This step thus is performed in accordance with a desired one of known SOI (silicon-on-insulator) technology methods; the single crystal silicon layer thus formed accordingly is referred to hereinafter as an SOI layer 8, which serves to form an MOS FET having a negligibly small gate leakage current.

As indicated by the arrows labelled B+, the SOI layer 8 then is doped for conversion to a p-type diffusion layer of $10^{16}$ cm$^{-3}$ density.

Solid phase epitaxy, a known SOI technology, affords an alternative method for forming the SOI layer 8. In accordance with that method, a polycrystalline silicon layer, formed on the entire substrate by a conventional CVD method, may be converted into a layer of single crystal silicon structure, recrystallized by a heat treatment of approximately 600° C., whereby the exposed single crystal structure of the contact region acts as seeds of the recrystallization process.

Figure 5C:
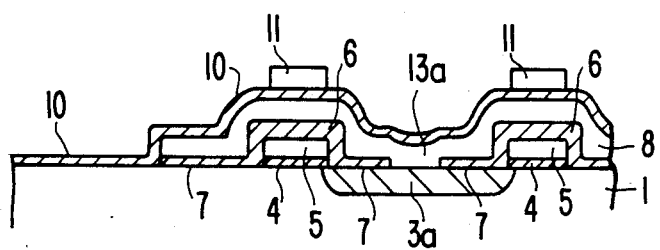

With reference to FIG. 5(c), the SOI layer 8 and the second gate insulating layer 7 are patterned simultaneously, thereby to expose the substrate for accommodating a source region including a ground line region. A third gate insulating region 10 of approximately 300 Å thickness then is formed by a heat oxidizing method step. This step is followed by performing a chemical vapor deposition (CVD) process step to form a tungsten silicide ($WSi_2$) layer of approximately 2,000 Å thickness, accompanied by a photolithographic process for patterning a gate electrode 11 of a write select transistor T2. The gate electrode 11 further is extended over the substrate (i.e., and thus perpendicular to the plane of the figure) to form a word select line WL (see, e.g., FIG. 2(b)).

Figure 5D:
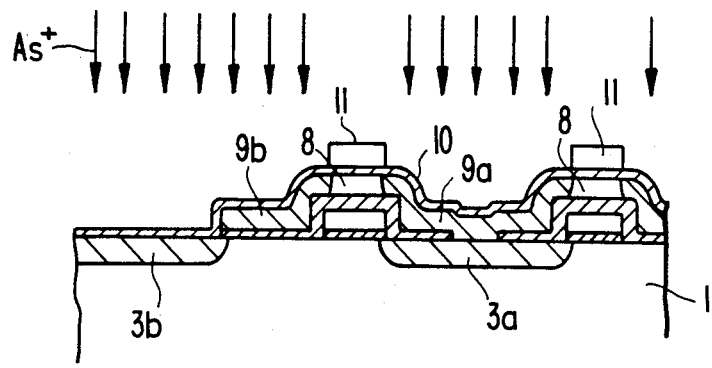

With reference to FIG. 5(d), and as indicated by the arrows labelled As+, the next step in the fabrication process is to perform an ion implanation of arsenic ions (As+) of approximately a $5 \times 10^{15}$ cm$^{-3}$ dosage with an accelerating energy of approximately 100 KeV over the entire substrate, followed by a known, predetermined heat treatment, thereby to form a first n+type region 9a which functions as the drain of a write select transistor T2, a second n+region 9b which functions as the source region of the write select transistor T2, and an n+type source region 3b for the storage transistor T3. The source region 3b of the storage transistor T3 moreover is extended along the substrate and thus perpendicular to the plane of FIG. 5(a), to act as a ground line (see FIG. 2(b)). As indicated by the cross hatching in FIG. 5(d), the n+type regions 9a and 9b are formed so as to extend and reach the SOI layer 8 underlying the gate electrode 11.

Figure 5E:
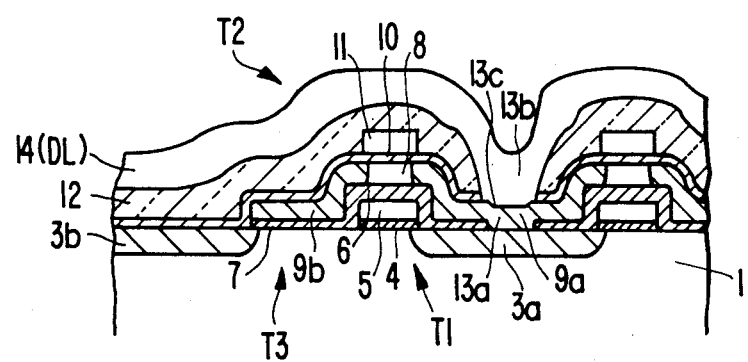

With reference to FIG. 5(e), the entire substrate then is covered with a phosphosilicate glass layer 12 formed by a suitable, conventional method wherein additionally a contact window 13b is formed in the layer 12 in alignment with a contact window 13c previously formed in the insulating layer 10, for exposing the underlying drain region 3a of the read select transistor T1. Subsequently, by a conventional method, a data bit line DL of aluminum or other metal is formed on the phosphosilicate glass layer 12, so that the data bit line DL is connected to the drain region 9a of the write select transistor T2 and through it to the drain region 3a of read select transistor T1 through the aligned contact windows 13b and 13c. Finally, a passivating layer is formed over the substrate and other final processes as well are performed (not shown) of conventional type for completing the DRAM cell.

As the foregoing detailed description of the processing steps for fabricating a DRAM cell in accordance with the invention makes clear, all of the fabricating steps may be performed by conventional semiconductor fabricating technologies and thus impose no increase in fabrication costs.

As will be apparent to those of skill in the art, the DRAM cell memory devices of the present invention afford many features and advantages not available in prior art devices and, as well, numerous modifications and adaptations thereof may be made, as suggested by the different embodiments of the invention herein set forth. Accordingly, it is intended by the appendend claims to cover all such features and advantages including such modifications and adaptations of the herein disclosed DRAM cell memory devices, as fall within the true spirit and scope of the invention.

What is claimed is:

1. A three-transistor dynamic random access memory cell formed on a silicon substrate, comprising:
    a read select MIS transistor having source, channel and drain regions formed in said silicon substrate, said read select MIS transistor being responsive to a read select signal for enabling a read operation for determining information stored in said cell;
    a first insulating layer formed over said read select MIS transistor;
    a semiconductor layer formed on said insulating layer;
    a write select MIS transistor having source and drain regions formed in said semiconductor layer in superposed relationship to, and separated by said first insulating layer from, said read select transistor, said first insulating layer having a contact window therein and said drain region of said write select transistor being connected through said contact window to said drain region of said read select MIS transistor, said write select MIS transistor being responsive to a write select signal for enabling writing of information into said cell;
    a storage MIS transistor having source, channel and drain regions formed in said substrate, said channel region of said storage MIS transistor comprising said source region of said read select MIS transistor and said drain region of said storage MIS transistor comprising said channel region of said read select MIS transistor; and
    said respective channel regions of said read select and storage MIS transistors being formed in a common level in said silicon substrate and directly connected therein between said source region of said storage MIS transistor and said drain region of said read select MIS transistor.

2. A memory cell as recited in claim 1, wherein:
    said read select MIS transistor further comprises a gate insulating layer on said substrate over said channel region thereof, and a gate electrode formed on said gate insulating layer;
    said first insulating layer being formed over said gate electrode; and
    said storage MIS transistor further comprises a gate electrode, said gate electrode of said storage MIS transistor comprising said source region of said write select MIS transistor.

3. A memory cell as recited in claim 2, wherein said write select MIS transistor further comprises:
    a channel region formed in said semiconductor layer between said source and drain regions thereof and overlying said first insulating layer in a portion thereof superposed on said gate electrode of said read select transistor;
    a gate insulating layer formed on said semiconductor layer and extending at least over said channel region of said write select MIS transistor; and
    a gate electrode formed on said gate insulating layer thereof.

4. A memory cell as recited in claim 3, further comprising:
    a read select conducting line extending parallel to the surface of said substrate and functioning as a read select line for conducting a read select signal to said memory cell, said gate electrode of said read select MIS transistor comprising a portion of said read select conducting line;
    a write select conducting line extending parallel to the surface of said substrate and functioning as a write select line for conducting a write select signal to said memory cell, said gate electrode of said write select MIS transistor comprising a portion of said write select conducting line; and
    a conducting region formed in said substrate and functioning as a ground conducting line for said memory cell, said source region of said storage MIS transistor comprising a portion of said ground conducting line region.

5. A memory cell as recited in claim 4, further comprising:
    a second insulating layer formed over said write select MIS transistor and defining a contact window therein aligned with said contact window in said first insulating layer; and
    a conducting line formed over said second insulating layer and extending through said aligned contact window of said second insulating layer for connection with said connected drain regions of said write and read select MIS transistors, and functioning as an output data line.

6. A memory cell as recited in claim 2, wherein:
    said write select MIS transistor further comprises a gate electrode and a channel region formed in said semiconductor layer between said source and drain regions thereof and overlying said first insulating layer in a portion thereof superposed on said gate electrode of said read select transistor;
    said gate electrode of said read select MIS transistor being shared as a gate electrode of said write select MIS transistor;
    said first insulating layer formed over said shared gate electrode of said read select and write select MIS transistors comprising a gate insulating layer of said write select MIS transistor; and
    said read select transistor and said write select transistor having respective, different threshold voltages to enable selective operation thereof in response to corresponding write and read select signals applied to said shared gate electrode.

7. A memory cell as recited in claim 6, further comprising:
    a conducting line extending parallel to and insulated from the surface of said substrate and functioning as a combined read/write select line for conducting corresponding read/write select signals to said memory cell, said shared gate electrode of said read select and said write select MIS transistors comprising a portion of said combined read/write select conducting line; and
    a conducting region in said substrate functioning as a ground conducting line for said memory cell, said source region of said storage MIS transistor comprising a portion of said ground conducting line region.

8. A memory cell as recited in claim 7, further comprising:
    a second insulating layer formed over said write select MIS transistor and defining a contact window therein aligned with said contact window in said first insulating layer; and
    a conducting line formed over said second insulating layer and extending through said aligned contact window of said second insulating layer for connection with said connected drain regions of said write and read select MIS transistors, and functioning as an output data line.

9. A memory cell as recited in claim 1, wherein said semiconductor layer in which said write select MIS transistor is formed comprises an SOI single crystal silicon layer.

10. A memory cell as recited in claim 1, wherein said read select MIS transistor and said storage MIS transistor comprise a single, dual gate electrode MIS transistor.

11. A memory cell as recited in claim 1, further comprising:
   a read select line formed on said substrate and insulated therefrom, a portion of said read select line being superposed on said channel region of said read select MIS transistor and comprising a gate electrode thereof; and
   a write select line formed on said substrate in insulated relationship therefrom, a portion thereof extending over said channel region of said write select MIS transistor and comprising a gate electrode of said write select MIS transistor.

12. A memory cell as recited in claim 11, further comprising:
   a diffused region comprising a ground conducting line formed on said substrate, a portion thereof being contiguous with and connected to said channel region of said storage MIS transistor and comprising said source region of said storage MIS transistor.

13. A memory cell as recited in claim 1, further comprising:
   a write/read select line formed on said substrate and insulated therefrom, a portion of said read/write select line extending over and being insulated from said channel region of said read select MIS transistor;
   said write select MIS transistor further comprising a channel region disposed in superposed relationship with respect to said portion of said write/read select line and insulated therefrom by said first insulating layer; and
   said portion of said write/read select line comprising a shared gate electrode of both said read select and write select MIS transistors, said read select MIS transistor and said write select MIS transistor having respective, different threshold voltages to enable selective operation thereof in response to corresponding read and write select signals applied to said write/read select line.

14. A memory cell as recited in claim 13, further comprising:
   a diffused region comprising a ground conducting line formed on said substrate, a portion thereof being contiguous with and connected to said channel region of said storage MIS transistor and comprising said source region of said storage MIS transistor.

* * * * *

UNITED STATES PATENT AND TRADEMARK OFFICE
CERTIFICATE OF CORRECTION

PATENT NO. : 4,669,062

DATED : May 26, 1987

INVENTOR(S) : Nakano

It is certified that error appears in the above-identified patent and that said Letters Patent is hereby corrected as shown below:

Col. 8, line 55, "falloff" should be --fall-off--.

Col. 9, line 47, "5000" should be --5000Å--.

Signed and Sealed this

Sixteenth Day of February, 1988

Attest:

DONALD J. QUIGG

*Attesting Officer*  *Commissioner of Patents and Trademarks*